United States Patent
Watanabe

(10) Patent No.: US 7,564,293 B2
(45) Date of Patent: Jul. 21, 2009

(54) SIGNAL CONVERSION CIRCUIT

(75) Inventor: Masafumi Watanabe, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 51 days.

(21) Appl. No.: 11/443,064

(22) Filed: May 31, 2006

(65) Prior Publication Data
US 2006/0214719 A1   Sep. 28, 2006

(30) Foreign Application Priority Data
Jun. 1, 2005   (JP)   ............................. 2005-161432

(51) Int. Cl.
*H03K 17/00*   (2006.01)
(52) U.S. Cl. .................. 327/407; 327/409; 327/108; 326/82; 326/83
(58) Field of Classification Search .............. None
See application file for complete search history.

(56) References Cited
U.S. PATENT DOCUMENTS 5,107,136 A * 4/1992 Stekelenburg ............... 327/112
6,154,066 A * 11/2000 Wen et al. ..................... 327/65
6,222,411 B1 * 4/2001 Chu et al. .................... 327/295
6,714,063 B2 * 3/2004 Nishizono .................... 327/345
7,061,282 B2 * 6/2006 Hu .............................. 327/108
7,157,944 B1 * 1/2007 Wang et al. ................... 327/58
2005/0248369 A1 * 11/2005 Matsumoto .................. 327/18
2007/0170990 A1 * 7/2007 Park ............................ 330/258

FOREIGN PATENT DOCUMENTS
JP   10-13210   1/1998

* cited by examiner

*Primary Examiner*—Tuan Lam
*Assistant Examiner*—Hiep Nguyen
(74) *Attorney, Agent, or Firm*—McGinn IP Law Group, PLLC

(57) ABSTRACT

A signal conversion circuit for converting an inputted differential signal into a single-ended signal comprises a differential amplifier circuit for amplifying the differential signal, and generating a first non-inverted signal and a first inverted signal being inverted the first non-inverted signal, a first inverter for generating a second non-inverted signal being inverted the first inverted signal and an interpolation unit for interpolating a phase difference between the first non-inverted signal and the second non-inverted signal.

13 Claims, 10 Drawing Sheets

RELATED ART

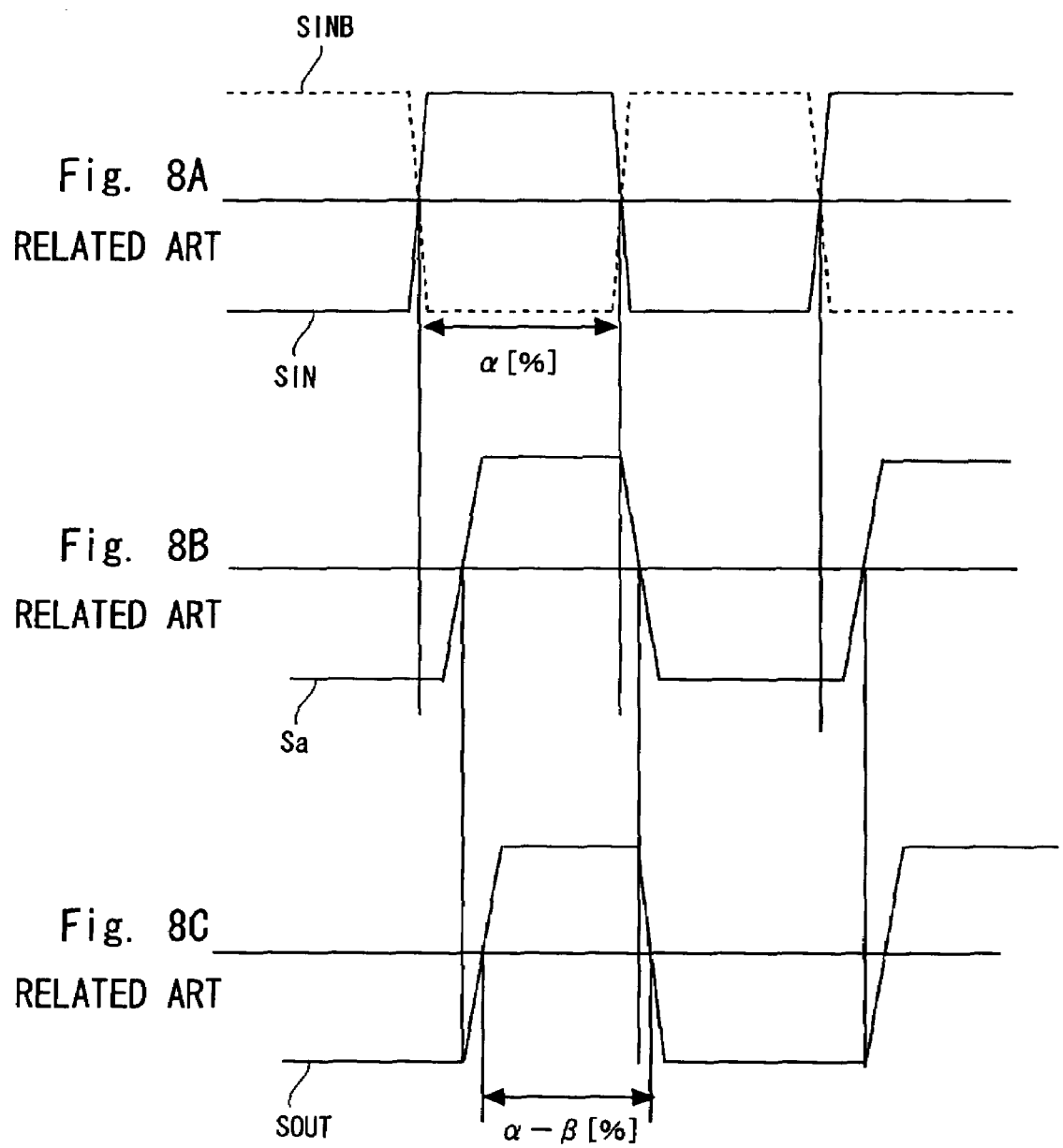

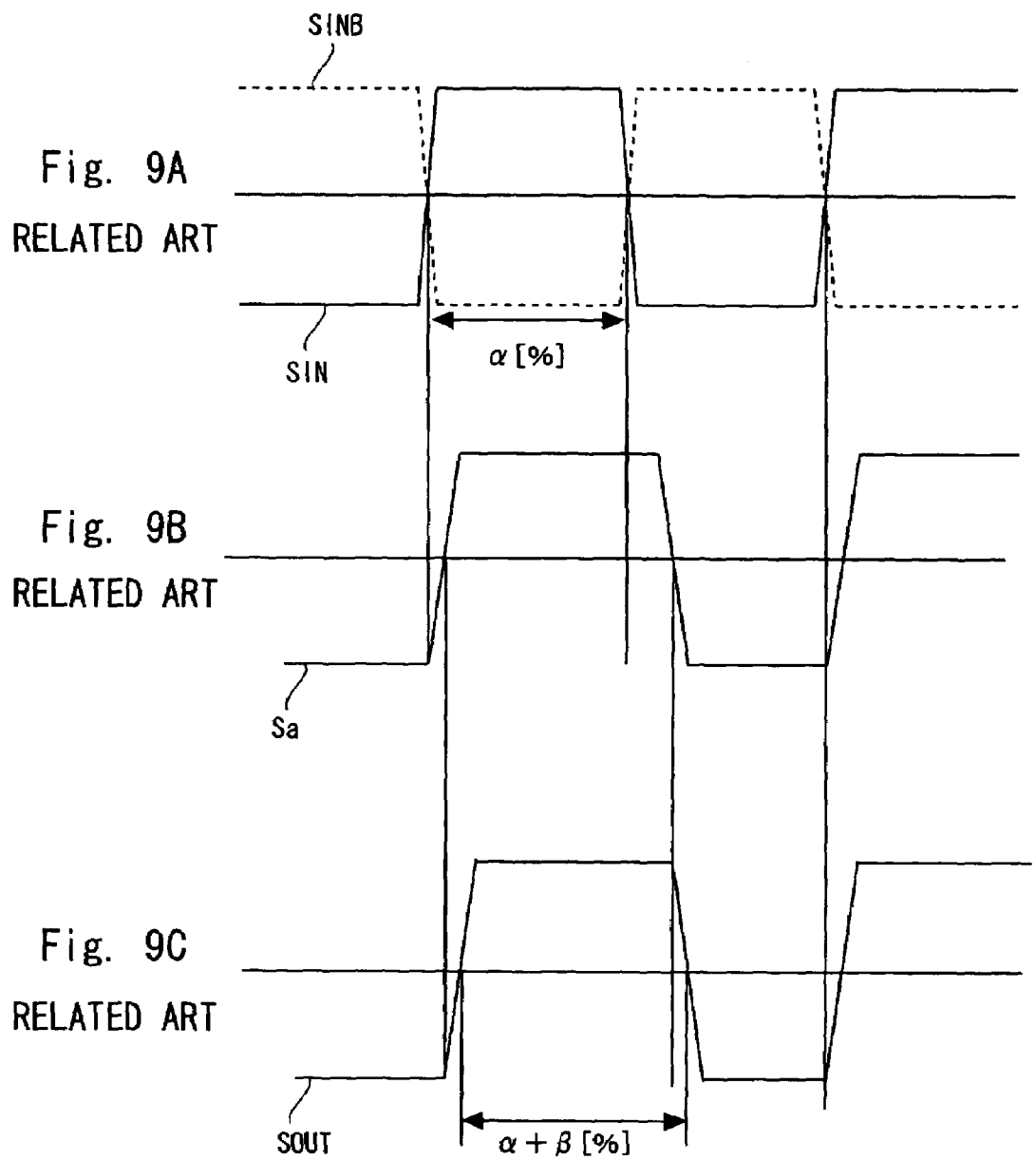

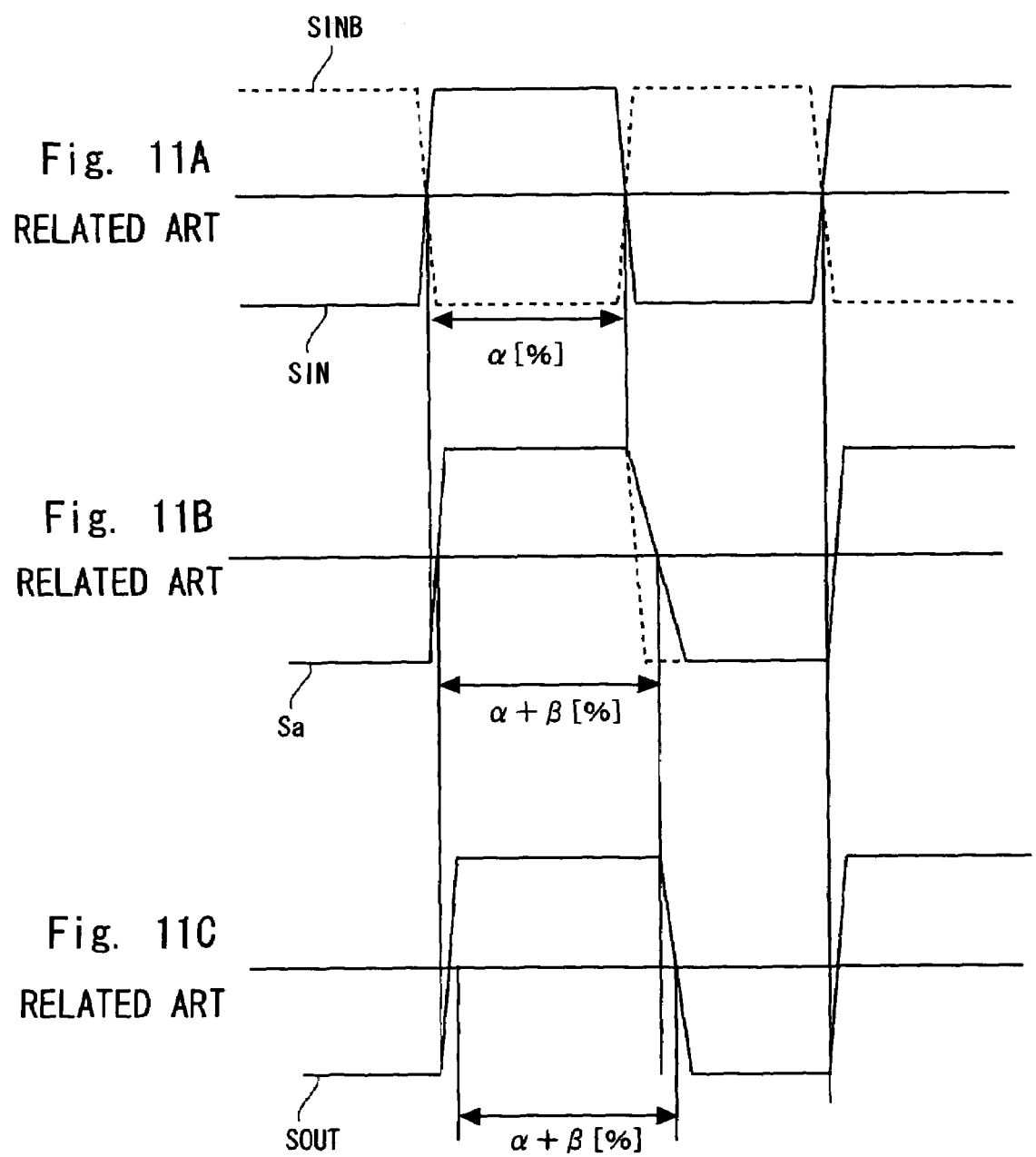

SIGNAL CONVERSION CIRCUIT

BACKGROUND OF THE INVENTION

1. Field of the Invention

The present invention relates to a signal conversion circuit, and particularly to a signal conversion circuit for converting an input differential signal to a single-ended signal.

2. Description of Related Art

In an input/output circuit for inputting/outputting a clock and a data signal, generally a differential signal is widely used so as to reduce noise in an inputting/outputting signal. A circuit receives a differential signal and converts it into a single-phase single-ended signal to supply to an internal circuit and the like.

FIG. 6 shows a configuration of a signal conversion circuit for converting a differential signal into a single-ended signal according to a conventional technique. As shown in the FIG. 6, the conventional signal conversion circuit includes a differential amplifier 610, and inverters 620 and 630.

As differential signals, an input signal SIN and an inverted input signal SINB are inputted to input terminals 601 and 602. The differential amplifier 610 converts differential signals into a single-ended signal Sa. The single-ended signal Sa is repeatedly inverted by the inverters 620 and 630, and an output signal SOUT is outputted from an output terminal 603.

In the differential amplifier 610, a P-channel MOS transistor (MOSFET: Metal Oxide Semiconductor Field Effect Transistor) P611 and an N-channel MOS transistor N611, are connected in series, and a P-channel transistor P612 and an N-channel MOS transistor N612 are connected in series. The P-channel MOS transistor P611 and the P-channel MOS transistor P612 are connected to form a current mirror circuit. The inverters 620 and 630 are comprised of P-channel MOS transistors P621 and P631, and N-channel MOS transistors N621 and N631 respectively.

FIG. 7 illustrates another configuration of a signal conversion circuit according to a conventional technique. As shown in F*ig*.7, the conventional signal conversion circuit includes a differential amplifier 710 and inverters 720, 730, and 740.

An input signal SIN and an inverted input signal SINB are inputted to the input terminals 701 and 702. The differential amplifier 710 converts the input signals to a single-ended signal Sa. The single-ended signal repeatedly inverted by the inverters 720 and 730, and an output signal SOUT is outputted from an output terminal 703. The inverter 740 is a dummy circuit for balancing an output from the differential amplifier 710.

As a conventional signal conversion circuit, a technique disclosed in Japanese Unexamined Patent Application Publication No. 10-13210 is well known. The technique disclosed in Japanese Unexamined Patent Application Publication No. 10-13210 adjusts a duty ratio by detecting a voltage that differential signals cross over and generating an offset signal. In this case, a circuit for detecting a cross-over voltage and generating an offset signal is needed, thereby complicating the circuit and increasing a size of the circuit.

However with a conventional signal conversion circuit shown in FIGS. 6 and 7, an error in duty ratio could be generated in a single-ended signal that is converted from a differential signal.

This issue is described in detail with reference to FIGS. 8A to 9C. FIGS. 8A to 8C show waveforms of signals for a conventional signal conversion circuit. For example an input signal SIN and an inverted input signal SINB, which are shown in FIG. 8A are inputted to a conventional signal conversion circuit.

In response to the input signal SIN, the N-channel MOS transistor N611 becomes conductive, a current flows in the P-channel MOS transistor P611, and a drain current flows between source-drain of the P-channel MOS transistor P612 as well. Further, in response to the inverted input signal SINB, the N-channel MOS transistor N612 becomes conductive and a drain current flows between drain-source of the N-channel MOS transistor N612. Then a signal Sa is generated from a relation between the drain current of the P-channel MOS transistor P612 and the drain current of the N-channel MOS transistor N612.

Accordingly as shown in FIG. 8B, at a falling edge of the input signal SIN (rising edge of the inverted input signal SINB), a level of the signal Sa reduces as only the N-channel MOS transistor N612 operates, a falling edge of the signal Sa occurs at an almost the same timing as a falling edge of the input signal SIN. However at a rising edge of the input signal SIN, a level of the signal Sa increases as three transistors, the N-channel MOS transistor N611, the P-channel MOS transistors P611 and P612, operates, thus a timing of a rising edge of the signal Sa delays from a timing of a rising edge of the input signal SIN. A difference in timings of a rising edge of the signal Sa and a rising edge of the input signal SIN is larger than a difference in timings of a falling edge of the signal Sa and a falling edge of the input signal SIN. That is, the signal Sa has a similar falling edge timing with the signal SIN whereas a rising timing is delayed, thereby making a pulse width narrower.

The signal Sa is inverted by the inverters 620 and 630. As a result, as shown in FIG. 8C, a duty ratio of the output signal SOUT is smaller than the input signal SIN by an error β.

An output waveform is formed in a similar manner for a conventional signal conversion circuit shown in FIG. 7. At a rising edge of the input signal SIN, a drain potential of the N-channel MOS transistor N711 falls, and a level of the signal Sa increases by the P-channel MOS transistor P712 being operated, accordingly a timing of the rising edge of the signal Sa delays from that of the input signal SIN. On the other hand at a falling edge of the input signal SIN, a level of the signal Sa decreases as only the N-channel MOS transistor P712 being operated, accordingly a timing of the falling edge of the signal Sa is almost the same as that of the input signal SIN, forming waveforms as in FIGS. 8B and 8C.

In case of inverting N-channel MOS transistors for P-channel MOS transistors to configure the conventional signal conversion circuits in FIGS. 6 and 7, waveforms are formed as in FIGS. 9A to 9C. As shown in FIGS. 9A to 9C, waveforms are formed in an opposite manner to FIGS. 8A to 8C. Specifically as shown in FIG. 9B, the signal Sa that is outputted from a differential amplifier rises almost at the same timing as a rising edge of the input signal SIN, and a falling edge timing delays from that of the input signal SIN. Accordingly as shown in FIG. 9C, a duty ratio for a waveform of the output signal SOUT is larger by the error β.

Not only by a delay in a timing of a signal, an error in duty ratio is generated when operating characteristics of P-channel MOS transistors and N-channel MOS transistors in a differential amplifier are imbalanced due to variations in production and an environment change such as a change in temperature. In this case, such an error is generated because of a difference in slopes of a rising edge and a falling edge of the signal Sa. For example FIGS. 10A to 10C illustrates an example in a case a rising edge slope of the signal Sa is less steep than a falling edge slope of the signal Sa. If a rising edge slope of the signal Sa becomes less steep, a rising edge of the output signal SOUT is delayed, thereby making a duty ratio of the output signal SOUT be smaller by the error β, in a similar manner as in FIGS. 8A to 8C. On the other hand FIGS. 11A to 11C illustrates an example in a case a falling edge slope of the signal Sa is less steep than a rising edge slope of the signal Sa. If a falling edge slope of the signal Sa becomes less steep, a falling edge of the output signal SOUT is delayed, thereby making a duty ratio of the output signal SOUT be larger by the error β, in a similar manner as in FIGS. 9A to 9C.

As described in the foregoing, in a conventional signal conversion circuit, a single-ended signal with a duty ratio smaller or larger by an error is outputted, due to a configuration of a differential amplifier, a variation in production tolerance, or an environment change including a change in temperature and the like.

SUMMARY OF THE INVENTION

According to an aspect of the present invention, there is provided a signal conversion circuit for converting an inputted differential signal into a single-ended signal comprises a differential amplifier circuit for amplifying the differential signal, and generating a first non-inverted signal and a first inverted signal being inverted the first non-inverted signal, a first inverter for generating a second non-inverted signal being inverted the first inverted signal and an interpolation unit for interpolating a phase difference between the first non-inverted signal and the second non-inverted signal.

According to an aspect of the present invention, there is provided a signal conversion circuit for converting an inputted differential signal into a single-ended signal comprises a first differential amplifier circuit for amplifying the differential signal, and generating a first non-inverted signal, a second differential amplifier circuit for amplifying the differential signal, and generating a first inverted signal, a first inverter for generating a second non-inverted signal being inverted the first inverted signal and an interpolation unit for interpolating a phase difference between the first non-inverted signal and the second non-inverted signal.

The signal conversion circuit of the present invention is capable of generating a single-ended signal with a duty ratio larger by an error and a single-ended signal with its duty ratio smaller by an error and interpolating the signals. Because a temporal gap between the two single-ended signals is interpolated, it is possible to accurately eliminate an error in duty ratio and also to reduce an occurrence of an error in duty ratio.

According to another aspect of the present invention, there is provided a signal conversion circuit that includes a conversion unit for converting a differential signal being inputted into a first single-ended signal with a duty ratio larger by an error, and a second single-ended signal with a duty ratio smaller by an error, and an interpolation unit for interpolating duty ratios of the first and the second single-ended signals.

Because the signal conversion circuit of the present invention interpolates a temporal gap between a single-ended signal with a duty ratio larger by an error and a single-ended signal with a duty ratio smaller by an error, it is possible to accurately eliminate an error in duty ratio and to reduce an occurrence of an error in duty ratio.

The present invention provides a signal conversion circuit that is capable of reducing an error in duty ratio generated in a single-ended signal converted from a differential signal.

BRIEF DESCRIPTION OF THE DRAWINGS

The above and other objects, advantages and features of the present invention will be more apparent from the following description taken in conjunction with the accompanying drawings, in which:

FIGS. 8A to 8C show waveforms of each signal in a signal conversion circuit according to a related art;

FIGS. 9A to 9C show waveforms of each signal in a signal conversion circuit according to a related art;

FIGS. 11A to 11C show waveforms of each signal in a signal conversion circuit according to a related art.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

A signal conversion circuit of a first embodiment is described hereinafter in detail. The signal conversion circuit of the first embodiment is characterized by generating a single-ended signal with a duty ratio larger by an error and a single-ended signal with a duty ratio smaller by an error and interpolating the signals, using two differential amplifiers and a plurality of inverters.

A configuration of the signal conversion circuit of the first embodiment is described hereinafter in detail with reference to FIG. 1. The signal conversion circuit is a circuit for converting a differential signal being inputted into a single phase single-ended signal. For example, a differential signal of a digital square wave or a differential signal of an analog sine curve signal are inputted to output a single-ended signal with a digital square wave.

A differential signal with a duty ratio of α [%] is inputted to the signal conversion circuit. That means that an input signal SIN with a duty ratio of α [%] and an inverted input signal SINB with a duty ratio of 100−α [%] are inputted as differential signals.

Figure 1:
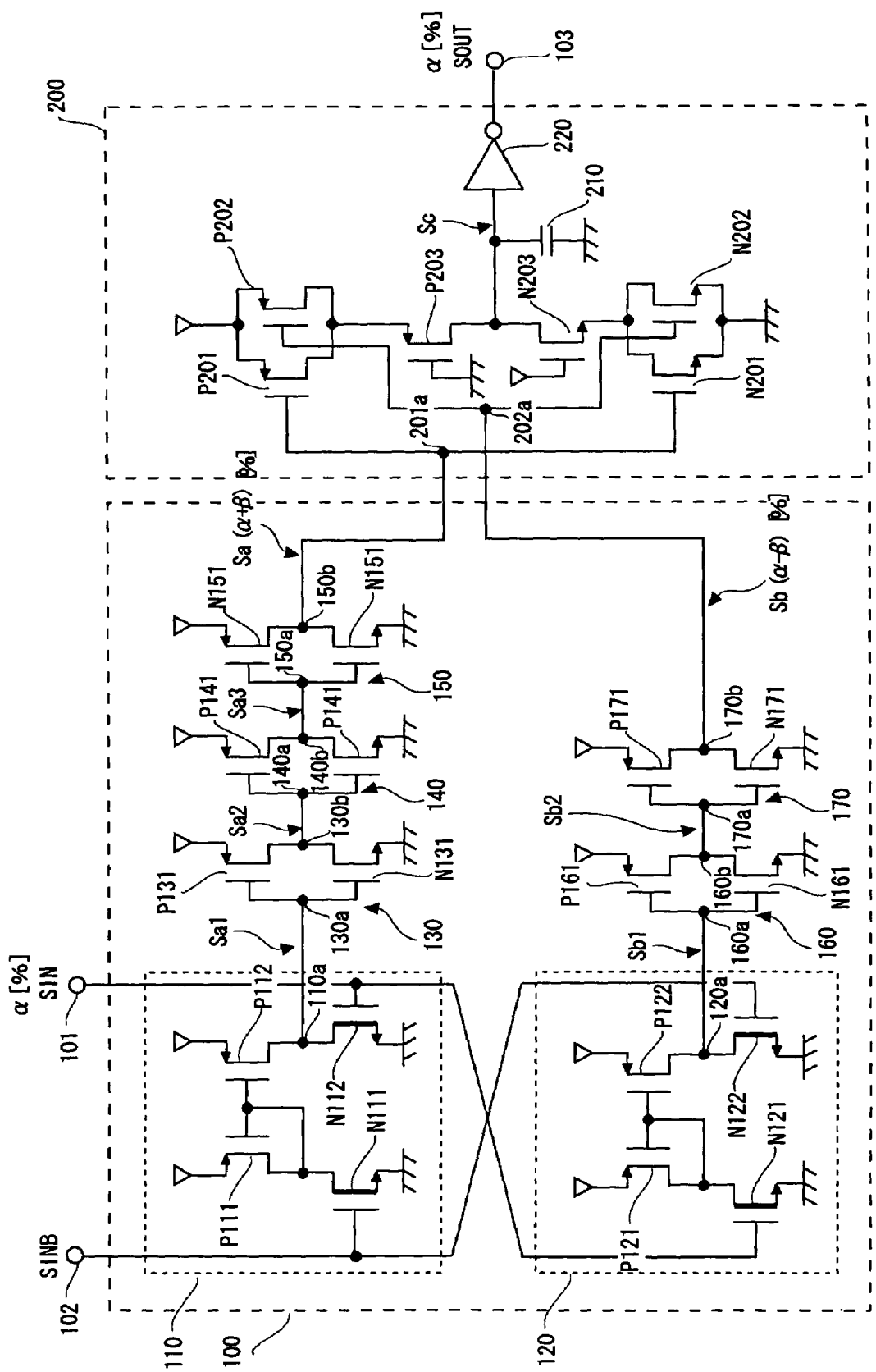
FIG. 1 is a circuit diagram of a signal conversion circuit according to the present invention.

As shown in FIG. 1, the signal conversion circuit includes a conversion unit 100 and an interpolation unit 200. The conversion unit 100 converts an input signal SIN and an inverted input signal SINB that are inputted to input terminals 101 and 102, and generates a single-ended signal Sa with a duty ratio larger by an error β and a single-ended signal Sb with a duty ratio smaller by an error β. The interpolation unit 200 interpolates a difference of the duty ratios between signals Sa and Sb, generated by the conversion unit 100. The difference of the duty ratios between signals Sa and Sb corresponds to a time difference between the signals as well as a phase difference. Therefore the interpolation unit 200 outputs an output signal SOUT with a duty ratio α % that an error β is being eliminated.

In the present invention, the error β indicates an error in a duty ratio generated in a differential amplifier. Although the error β is generated largely due to principle of operation of the differential amplifier, it may include an error generated because of transistor characteristics from a change in operating environment such as temperature and power supply voltage, and an error generated due to variations in production tolerance.

As shown in FIG. 1, the conversion unit 100 includes differential amplifiers 110 and 120, inverters 130, 140, 150, 160, and 170. The differential amplifier 110 (second differential pair) amplifies an inputted differential signal, and generates a single-ended signals Sa1. The differential amplifier 120 (first differential pair) amplifies an inputted differential signal, and generates a single-ended signals Sb1. The differential amplifier 110 converts an differential signal being inputted and outputs the signal Sa1 with a duty ratio including an error β. For example the signal Sa1 is in-phase with an inverted input signal SINB. The signal Sa1 is inverted by the inverter 130 to be a signal Sa2, the signal Sa2 is inverted by the inverter 140 to be a signal Sa3, and the signal Sa3 is inverted by the inverter 150 to be a signal Sa. In this case, assuming that a duty ratio is smaller by an error β, a duty ratio for the signal Sa1 is 100−α−β [%], a duty ratio for the signal Sa2 is α+β [%], a duty ratio for the signal Sa3 is 100−(α+β) [%], and a duty ratio for the signal Sa is α+β [%].

The differential amplifier 120 converts a differential signal, being inputted in an inversed way from the differential amplifier 110, and outputs a signal Sb1 with a duty ratio including an error β, which is an inverted signal Sa1 in the differential amplifier 110. For example the signal Sb1 is in-phase with the input signal SIN. The signal Sb1 is inverted by the inverter 160 to be a signal Sb2, and the signal Sb2 is inverted by the inverter 170 to be a signal Sb. In a similar manner as described above, a duty ratio for the signal Sb1 is α−β [%], a duty ratio for the signal Sb2 is 100−(α−β) [%], and a duty ratio for the signal Sb is α−β [%].

For example the signal Sb1 or the signal Sb is a first non-inverted signal, the signal Sa1 is a first inverted signal, and the signal Sa2 or the signal Sa is a second non-inverted signal. The first non-inverted signal and the second non-inverted signal are interpolated by the interpolation unit 200. For example the inverter 150 is a first inverter for generating a second non-inverted signal, which is an inverted first inverted signal.

In a case a duty ratio of the output signal of the differential amplifier is larger than an inputted differential signal by an error β (for example when swapping N-channel MOS transistors for P-channel MOS transistors, which is described later), a relation between the signal Sa and the signal Sb is reversed. In such a case, a duty ratio for the signal Sa1 is 100−α+β [%], a duty ratio for the signal Sa2 is α−β [%], a duty ratio for the signal Sa3 is 100−(α−β) [%],a duty ratio for the signal Sa is α−β [%], a duty ratio for the signal Sb1 is α+β [%], a duty ratio for the signal Sb2 is 100−(α+β) [%], and a duty ratio for the signal Sb is α+β [%].

In order for the signals Sa and Sb to accurately satisfy a relation between the duty ratios (α+β and α−β), it is preferable that the differential amplifiers 110 and 120 are symmetric to each other, and formed with similar transistors. It is also preferable that the inverters 130 and 160, and the inverters 140 and 170 are symmetric to each other, and formed with similar transistors. Further, preferably the inverter 150 is able to generate an inverted signal that is accurate and with as least delay as possible. For example when a signal with a duty ratio of 50% is inputted to the inverter 150, the inverter 150 outputs a signal with a duty ratio of 50%, and when a signal with a duty ratio of 40% is inputted, the inverter 150 outputs a signal with a duty ratio of 60%. That means that a threshold of the inverter 150 is in an approximately intermediate potential between high and low level, with a rising and falling edge of an output signal being almost the same slope.

As shown in FIG. 1, the differential amplifier 110 includes P-channel MOS transistors P111 and P112, N-channel MOS transistors N111 and N112. The P-channel MOS transistor P111 (second transistor) and the N-channel MOS transistor N111 (first transistor) are connected in series between a power supply potential and a ground potential. The P-channel MOS transistor P112 (fourth transistor) and the N-channel MOS transistor N112 (third transistor) are connected in series between a power supply potential and a ground potential. The P-channel MOS transistor P111 and the P-channel MOS transistor P112 are connected to form a current mirror circuit.

A source of the N-channel MOS transistor N111 is connected to a ground potential, a gate is connected to an input terminal 102, and a drain is connected to a drain of the P-channel MOS transistor P111. A source of the P-channel MOS transistor P111 is connected to a power supply potential, a gate is connected to drain and a gate of the P-channel MOS transistor P112. A source of the N-channel MOS transistor N112 is connected to a ground potential, a gate is connected to the input terminal 101, and a drain is connected to a drain of the P-channel MOS transistor 112. A source of the P-channel MOS transistor P112 is connected to a power supply potential, a gate is connected to the P-channel MOS transistor P111 and a drain is connected to the N-channel MOS transistor N112.

An intermediate node between the P-channel MOS transistor P112 and the N-channel MOS transistor N112, which is a drain of the P-channel MOS transistor P112 or a drain of the N-channel MOS transistor N112, is to be an output node 110a for outputting the signal Sa1.

The differential amplifier 120 is configured in the same way as the differential amplifier 110. Specifically, the differential amplifier 120 includes P-channel MOS transistors P121 and P122, and N-channel MOS transistors N121 and N122. A gate of the N-channel MOS transistor N121 is connected to the input terminal 101 and a gate of the N-channel MOS transistor N112 is connected to the input terminal 102. The signal Sb1 is outputted from an output node 120, which is an intermediate node between the P-channel MOS transistor P122 and the N-channel MOS transistor N122.

In this embodiment, the N-channel MOS transistors N111, N112, N121, and N122 are depletion type transistors. A depletion type transistor is able to operate even in a case a differential signal being inputted is a small analog signal. On the other hand, if an input differential signal has a voltage level that exceeds an operating point of an enhancement type transistor, it is possible to reduce leak current by changing from the depletion type transistor to enhancement type transistor for the N-channel MOS transistors N111, N112, N121, and N122.

The inverters 130, 140, 150, 160, and 170 are configured in the same way, each including a P-channel transistor and a N-channel MOS transistor that are connected in series between a power supply potential and a ground potential. Specifically, the inverter 130 is comprised of a P-channel MOS transistor P131 and a N-channel MOS transistor N131, the inverter 140 is comprised of a P-channel MOS transistor P141 and a N-channel MOS transistor N141, the inverter 150 is comprised of a P-channel MOS transistor P151 and a N-channel MOS transistor N151, the inverter 160 is comprised of a P-channel MOS transistor P161 and a N-channel MOS transistor N161, and the inverter 170 is comprised of a P-channel MOS transistor P171 and a N-channel MOS transistor N171.

In each inverter, a source of a P-channel MOS transistor is connected a power supply potential and a source of a N-channel MOS transistor is connected to a ground potential. Gates of the P-channel MOS transistors and the N-channel MOS transistors are connected to each other, and intermediate nodes between them become input nodes (130a to 170a). Drains of the P-channel MOS transistors and the N-channel MOS transistors are connected to each other, and intermediate nodes between them become output nodes (130b to 170b).

The inverter 130 is connected to an output node 110a of the differential amplifier 110, and an output node 130b is connected to an input node 140a of the inverter 140 to output the signal Sa2. An input node 150a of the inverter 150 is connected to an output node 140b of the inverter 140 to input the signal Sa3, and an output node 150b is connected to an input node 201a of the interpolation unit 200 to output the signal Sa2. An input node 160a of the inverter 160 is connected to an output node 120a of the differential amplifier 120 to input the signal Sb1, and an output node 160b is connected to an input node 170a of the inverter 170 to output the signal Sb2. The inverter 170 is connected to an input node 202a of the interpolation unit 200 to output the signal Sb.

As shown in FIG. 1, the interpolation unit 200 includes P-channel MOS transistors P201, P202, and P203, N-channel MOS transistors N201, N202, and N203, a capacitor 210, and an inverter (third interpolation inverter) 200.

For example the P-channel MOS transistor P201 (third interpolation transistor) and the N-channel MOS transistor N201 (fourth interpolation transistor) are used to configure an inverter for the signal Sa (second inverter interpolation), and the P-channel MOS transistor P202 (first interpolation transistor) and the N-channel MOS transistor N202 (second interpolation transistor) are used to configure an inverter for the signal Sb (first interpolation inverter).

The P-channel MOS transistor P201 and the N-channel MOS transistor N201 invert the signal Sa, and generate an inverted signal Sa. The P-channel MOS transistor P202 and the N-channel MOS transistor N201 invert the signal Sb, and generate an inverted signal Sb. Those inverted signals are used to charge/discharge to the capacitor 210 to generate a signal Sc. The inverter 220 inverts the signal Sc and outputs the output signal SOUT.

Gates of the P-channel MOS transistor P201 and the N-channel MOS transistor N201 are connected to each other, and an intermediate node between them makes an input node 201a to input the signal Sa. Similarly, gates of the P-channel MOS transistor P202 and the N-channel MOS transistor N202 are connected to each other, and an intermediate node between them makes an input node 202a to input the signal Sb.

The P-channel MOS transistor P201 and the P-channel MOS transistor P202 are connected in parallel to configure a first parallel circuit. Sources of the P-channel MOS transistor P201 and the P-channel MOS transistor P202 are connected to each other and an intermediate node between them is connected to a power supply potential. Drains of the P-channel MOS transistors P201 and P202 are connected to each other, and an intermediate node between them is connected to a source of the P-channel MOS transistor P203. Similarly, the N-channel MOS transistor N201 and the N-channel MOS transistor N202 are connected in parallel to configure a second parallel circuit. Sources of the N-channel MOS transistor N201 and N202 are connected to each other and an intermediate node between them is connected to a ground potential. Drains of the N-channel MOS transistor N201 and the N-channel MOS transistor N202 are connected to each other, and an intermediate node between them is connected to a source of the N-channel MOS transistor N203.

The P-channel MOS transistor P203 and the N-channel MOS transistor N203 are connected in series between the P-channel MOS transistors P201 and P202, and the N-channel MOS transistors N201 and N202, and operates in a conductive state at any time. A gate of the P-channel MOS transistor P203 is connected to a ground potential and a gate of the N-channel MOS transistor N203 is connected to a power supply potential. Drains of the P-channel MOS transistor P203 and the N-channel MOS transistor N203 are connected to each other, and an intermediate node between them is connected together to one end of the capacitor 210 and an input end of the inverter 220. Another end of the capacitor 210 is connected to a ground potential and an output end of the inverter 220 is connected to an output terminal 103.

The P-channel MOS transistor P203 and the N-channel MOS transistor N203 function as resistances for reducing short circuit current that flows between the P-channel MOS transistor P201 and the N-channel MOS transistor N202, and the P-channel MOS transistor P202 and the MOS transistor N201, that is generated due to a phase difference between the signals Sa and Sb. The P-channel MOS transistor P203 and the N-channel MOS transistor N203 also includes a function for reducing an influence of capacitive coupling generated between the signals Sa and Sc, and the signals Sb and Sc due to parasitic capacitance inside the P-channel MOS transistors P201 and P202, and the N-channel MOS transistors N201 and N202. That is, the P-channel MOS transistor P203 and the N-channel MOS transistor N203 reduce a leakage from the signals Sa and Sb to the signal Sc. However, the circuit is operable as an interpolation circuit even without the P-channel MOS transistor P203 and the N-channel MOS transistor N203.

Figure 2:
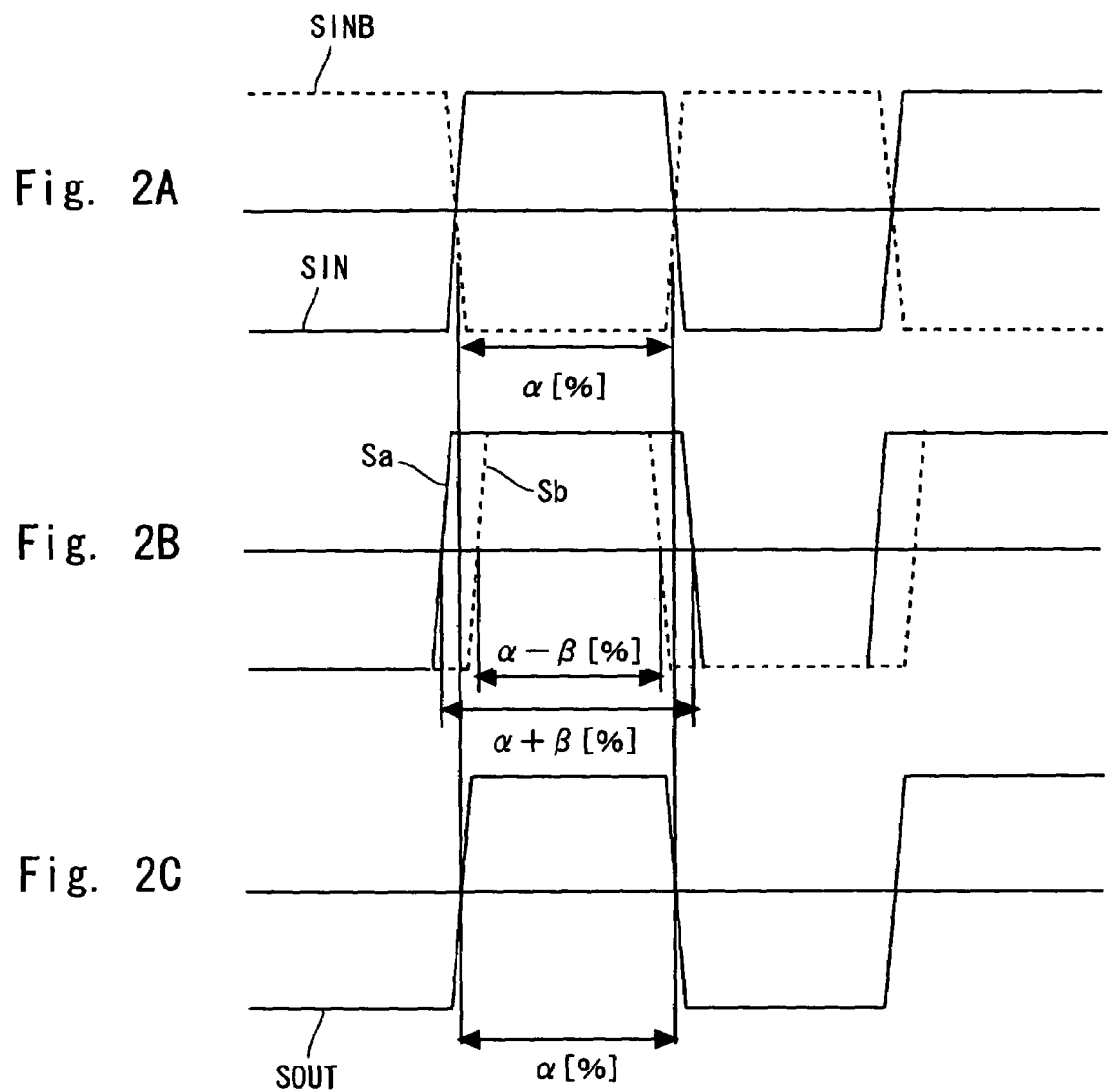
FIGS. 2A to 2C show waveforms of each signal in a signal conversion circuit according to the present invention.
Figure 3:
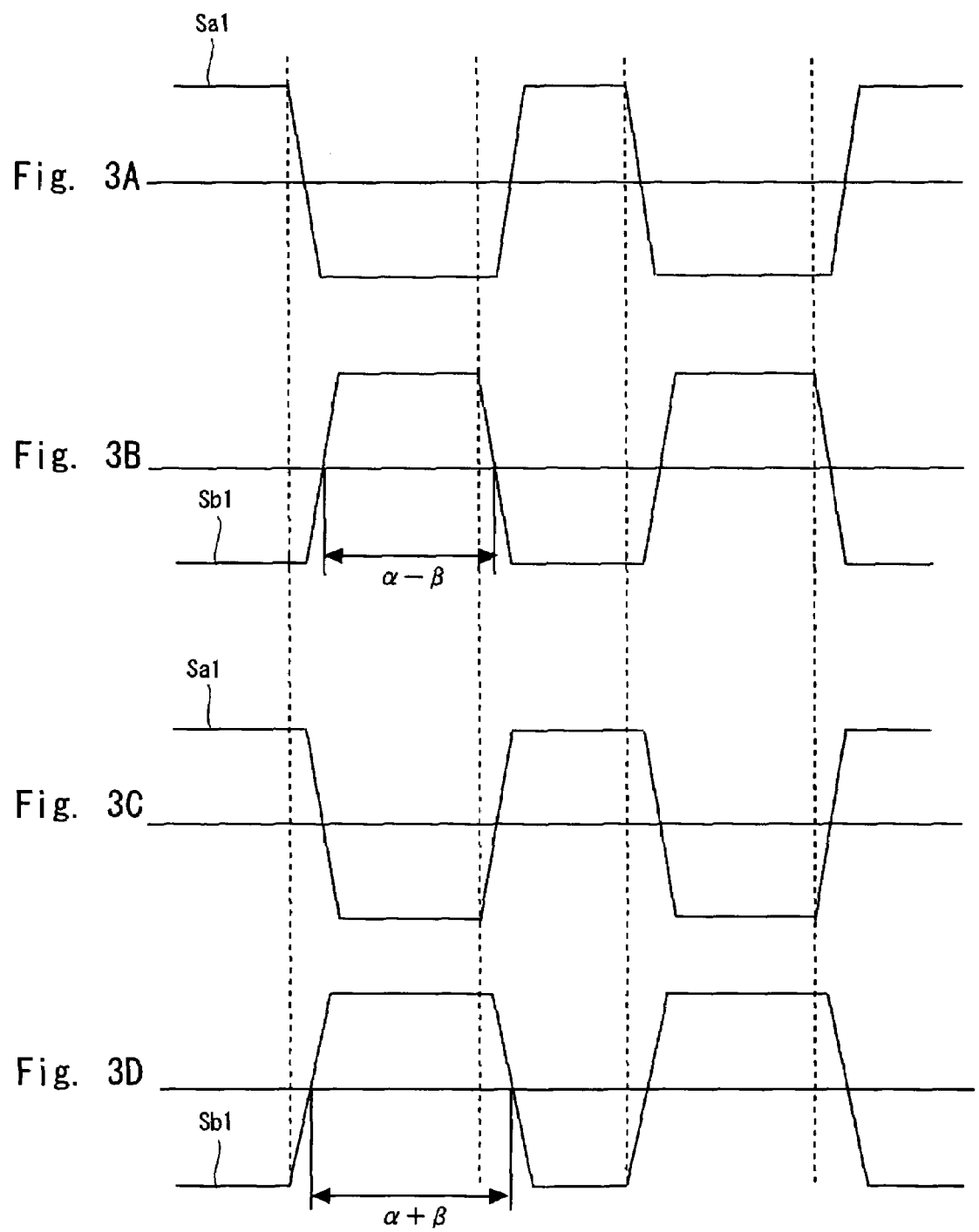
FIGS. 3A to 3D show waveforms of each signal in a signal conversion circuit according to the present invention.
Figure 4:
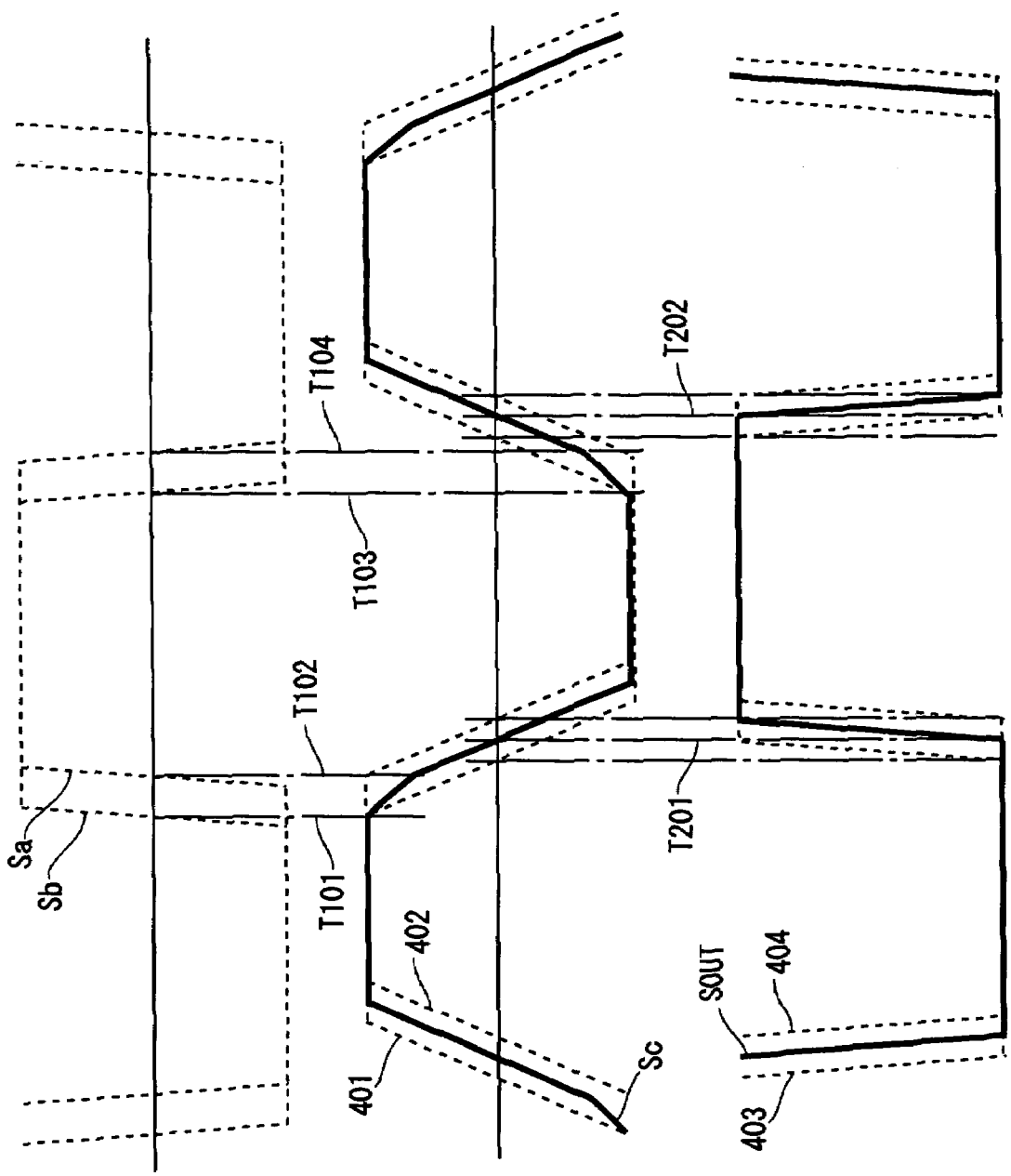
FIGS. 4A to 4C show waveforms of each signal in a signal conversion circuit according to the present invention.

An operation of the signal conversion circuit of this embodiment is explained hereinafter with reference to FIGS. 2A to 4C. FIGS. 2A to 2C illustrate wave forms of signals for a signal conversion circuit in FIG. 1. To a signal conversion circuit, an input signal SIN and an inverted input signal SINB as shown in FIG. 2A are inputted. Although a differential signal being inputted in this case is a square wave, it will be of the same behavior even with an analog signal such as sine curve.

If the input signal SIN and the inverted input signal SINB are inputted, signals Sa1 and Sb1 as shown in FIGS. 3A and 3B are generated by the differential amplifiers 110 and 120. That is, in the differential amplifier 110, if the inverted input signal SIB exceeds a threshold of the N-channel MOS transistor N111, the N-channel MOS transistor N111 becomes conductive and a drain current flows between drain-source, thereby lowering a drain potential. At this time, a gate potential of the P-channel MOS transistor P111 falls and becomes conductive, and a drain current flows between source-drain. Accordingly if the inverted input signal SINB is less or equal to a threshold of the N-channel MOS transistor N111, a drain current of the P-channel MOS transistor P112 does not flow.

If the input signal SIN exceeds a threshold of the N-channel MOS transistor N112, N-channel MOS transistor N112 becomes conductive and a drain current flows between drain-source of the N-channel MOS transistor N112. Accordingly if the input signal SIN is less or equal to a threshold of the N-channel MOS transistor N112, a drain current of the N-channel MOS transistor N112 does not flow.

A signal Sa1 is created by subtracting a drain current of the N-channel MOS transistor N112 from a drain current of the P-channel MOS transistor P112. That is, at a rising edge of the inverted input signal SINB (falling edge of the input signal SIN), the P-channel MOS transistor P112 becomes conductive, drain current increases, the N-channel MOS transistor N112 becomes non-conductive, and drain current reduces, thereby making the signal Sa1 to be high-level. At a falling edge of the inverted input signal SINB (rising edge of the input signal SIN), the P-channel MOS transistor P112 becomes non-conductive, drain current reduces, the N-channel MOS transistor N112 becomes conductive, and drain current increases, thereby making the signal Sa1 to be low-level.

A waveform for the signal Sa1 is formed as in FIG. 3A. Dotted lines in FIGS. 3A to 3D indicate rising or falling edge timings of the input signal SIN and the inverted input signal SINB. Specifically, as in a conventional technique, at a falling edge of the inverted input signal SINB, only the N-channel MOS transistor N112 needs to operates, thereby making a falling edge of the signal Sa1 to be almost the same timing as that of the inverted input signal SIBN. At a rising edge of the inverted input signal SINB, three transistors, the N-channel MOS transistor N111, the P-channel MOS transistors P111 and P112, need to operate, thereby making a rising edge of the signal Sa1 to delay from that of the inverted input signal SINB.

On the other hand, the differential amplifier 120 operates in the same manner as the differential amplifier 110, generating the signal Sb1 as shown in FIG. 3B. Because a signal to be inputted to the differential amplifier 120 is in reverse to the differential amplifier 110, the output signal Sb1 is reversed phase of the signal Sa1, which is an inverted signal Sa1. In this case, a falling edge of the signal Sb1 is almost the same timing as that of the input signal SIN, and a rising edge timing of the signal Sb1 delays from that of the input signal SIN. As a result, a duty ratio for the signal Sa1 is 100−α−β [%] and a duty ratio for the signal Sb1 is α−β [%].

In case of swapping N-channel MOS transistors for the P-channel MOS transistors to configure the signal conversion circuit in FIG. 1, the signals Sa1 and Sb1 have waveforms as in FIGS. 3C and 3D. For example, suppose a case of using P-channel MOS transistors for the transistors the input signal SIN and the inverting input signal SINB are inputted, and using N-channel MOS transistors for the transistors that are connected in series with the P-channel MOS transistors to configure a current mirror. In this case, waveforms are formed as in FIGS. 3C and 3D, reversed waveforms from FIGS. 3A and 3B. That is, as in a conventional technique shown in FIG. 3C, a rising edge of the signal Sa1 is almost the same timing as that of the inverted input signal SINB, and a falling edge timing delays from that of the inverted input signal SINB. As shown in FIG. 3D, a rising edge of the signal Sb1 is almost the same timing as that of the inverted input signal SIN, and a falling edge timing delays from that of the inverted input signal SIN. As a result, a duty ratio of the signal Sa1 is 100−α+β [%], and a duty ratio of the signal Sb1 is α+β [%].

The signals Sa1 and Sb1 are repeatedly inverted by the inverters 130, 140, 150, 160, and 170, to be signals Sa and Sb shown in FIG. 2B. To be specific, the signal Sa1 is repeatedly inverted by the inverters 130, 140, and 150, while the signal Sb1 is repeatedly inverted by the inverters 160 and 170. Slopes of the signals at rising edge and falling edge as shown in FIGS. 3A to 3D are sharpened by the inverters, and the signals almost as a square are created. A duty ratio for the signal Sa is α+β [%] and a duty ratio for the signal Sb is α−β [%].

Furthermore, the signals Sa and Sb are interpolated by the interpolation unit 200 to be the output signal SOUT as shown in FIG. 2C. A duty ratio for the output signal SOUT is ((α−β)+(α+β))/2, a signal with duty ratio α [%] where an error β is eliminated from the signals Sa and Sb. A rising edge of the output signal SOUT rises almost at a middle of rising edges of the signals Sa and Sb, while a falling edge of the output signal SOUT falls almost at a middle of falling edges of the signals Sa and Sb.

An operation of the interpolation unit 200 is described hereinafter in detail with reference to FIGS. 4A to 4C. FIGS. 4A to 4C show waveforms of each signal for the interpolation unit 200.

In a similar manner as the FIG. 2B, signals Sa and Sb as in FIG. 4A are inputted to the interpolation unit 200. When the signals Sa and Sb are inputted, a waveform for the signal Sc is formed as in FIG. 4B. Dotted lines in FIG. 4B indicate the signal Sc in a case only the signal Sa is inputted.

At rising edges of the signals Sa and Sb, if the signal Sb exceeds a threshold of the N-channel MOS transistor N201 at T101, only the N-channel MOS transistor N201 becomes conductive, a current flows from a drain to a source, and a charge of the capacitor 210 is discharged, thereby making the signal Sc start falling. Then at T102, if the signal Sa exceeds a threshold of the N-channel MOS transistor N202, the N-channel MOS transistor N202 becomes conductive and a current flows from a drain to a source. Then a charge of the capacitor 210 is discharged through both of the N-channel MOS transistor N201 and the N-channel MOS transistor N202, making the signal Sc to fall at a slope twice steeper. When all charges of the capacitor 210 are discharged, the signal Sc falls to a specified low level. That means that the signal Sc falls to low level if the signals Sa and Sb are at a high level.

Falling edges for the signals Sa and Sb operate in the same manner. At T103, if the signal Sa falls below or equal to a threshold of the P-channel MOS transistor P201, only the P-channel MOS transistor P201 becomes conductive, a current flows from a source to a drain, and the capacitor 210 is charged, making the signal Sc start rising. Then at T104, if the signal Sb falls below or equal to a threshold of the P-channel MOS transistor P202, the P-channel MOS transistor P202 becomes conductive and a current flows from a source to a drain. Then as the capacitor 210 is charged through both the P-channel MOS transistor P201 and the P-channel MOS transistor P202, the signal Sc rises at a slope twice steeper. After charging to the capacitor 210 is completed, the signal Sc rises to a specified high level. That means that the signal Sc rises to high level if the signals Sa and Sb are at a low level.

After the signal Sc is generated, the output signal SOUT as in FIG. 4C is outputted by the inverter 220. A dotted line 403 in FIG. 4C indicates the output signal SOUT in a case only the signal Sa is inputted, while a dotted line 404 indicates the output signal SOUT in a case only the signal Sb is inputted.

At a falling edge of the signal Sc, if the signal Sc falls below or equal a threshold of the inverter 220 at T202, the output signal SOUT rises from low level to high level. At a rising edge of the signal Sc, if the signal Sc exceeds a threshold of the inverter 220 at T202, the output signal SOUT falls from low level to high level. Therefore, a middle point of the rising edges of the signals Sa and Sb is a rising edge of the output signal SOUT, while a middle point of the falling edges of the signals Sa and Sb is a falling edge of the output signal SOUT.

In this embodiment as described in the foregoing, a circuit for converting a differential signal into a single-ended signal generates a single-ended signal larger with duty ratio larger by an error and a single-ended signal with duty ratio smaller by an error, and interpolates the signals. Specifically, averaging an increase and a decrease in duty ratio for an error enables to accurately eliminate an error in duty ratio generated in a differential amplifier. As the conversion unit 100 can be comprised of a combination of a differential amplifier and an inverter, and the interpolation unit 200 can be comprised of an inverter and a capacitor, a circuit may easily be configured without having a complex circuit.

As shown in FIGS. 10A to 11C, even if an error is generated in a duty ratio due to a difference in slopes of rising and falling edges of the signals Sa1 and Sb1 that are outputted from a differential amplifier, the difference in the duty ratio can be eliminated by applying this embodiment. Accordingly not only an error generated by a differential amplifier but also an error in duty ratio caused by variations in production tolerance or environment change can be reduced.

As this embodiment enables to reduce an error in duty ratio of a differential signal and a single-ended signal, it is especially effective if used in a circuit that requires accuracy in a duty ratio for example for generating a clock signal from a differential signal. For example, in DLL (delay Locked Loop) for a memory I/F, a characteristic called DCD (Duty Cycle Distortion) that indicates a difference in duty ratios of input and output signals can be improved by applying the present embodiment.

Second Embodiment

A signal conversion circuit according to a second embodiment is described hereinafter in detail. The signal conversion circuit of the second embodiment is characterized by generating a single-ended signal with a duty ratio larger by an error and a single-ended signal with a duty ratio smaller by an error and interpolating the signals.

Figure 5:
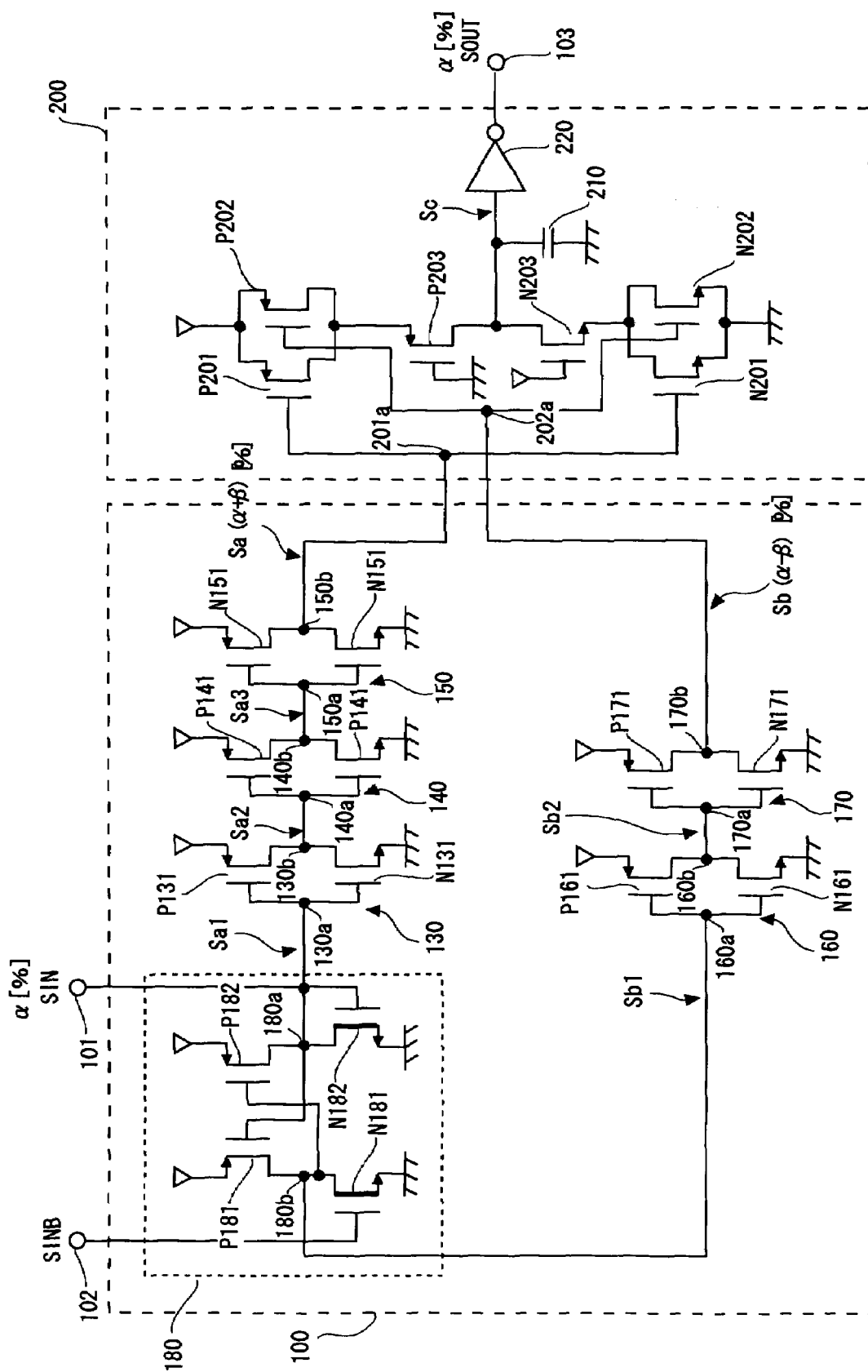
FIG. 5 is a circuit diagram of a signal conversion circuit according to the present invention.
Figure 6:
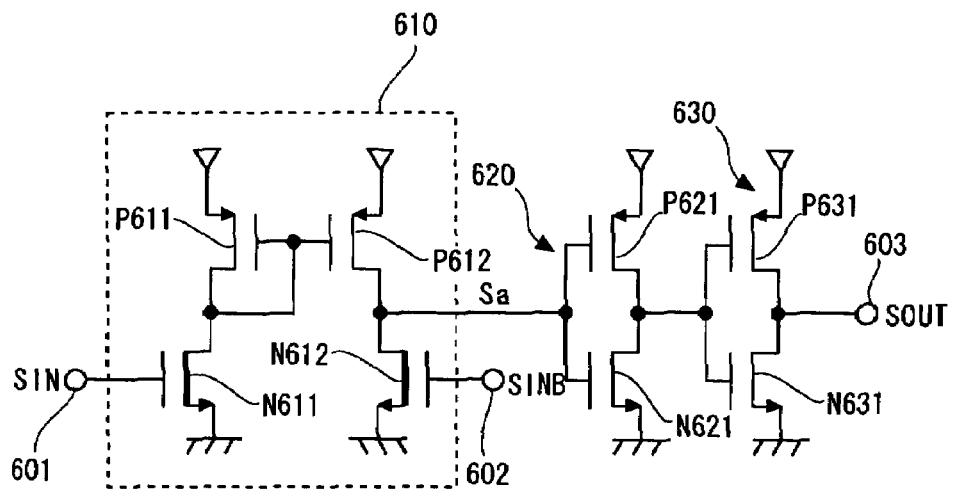
FIG. 6 is a circuit diagram of a signal conversion circuit according to a related art.
Figure 7:
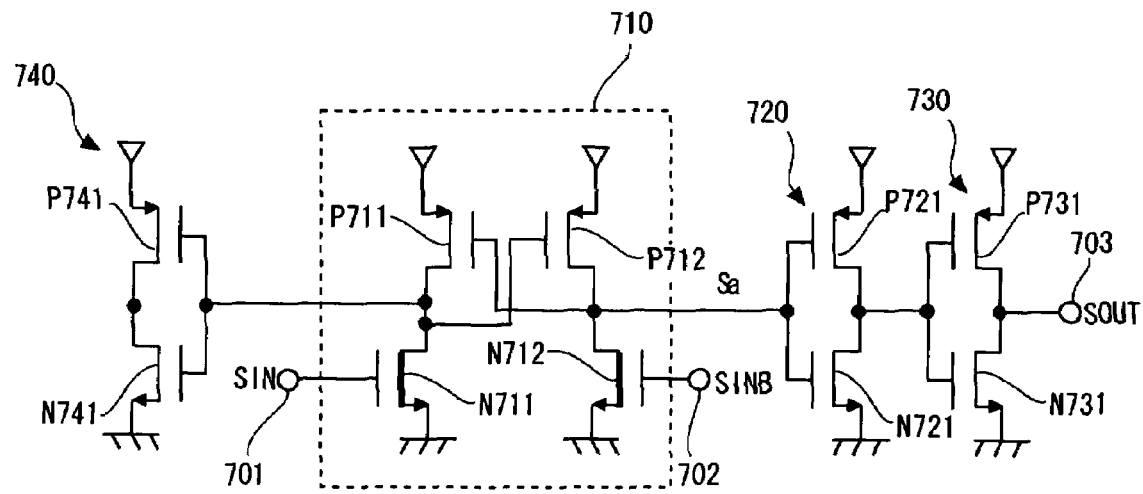
FIG. 7 is a circuit diagram of a signal conversion circuit according to a related art.
Figure 10A:
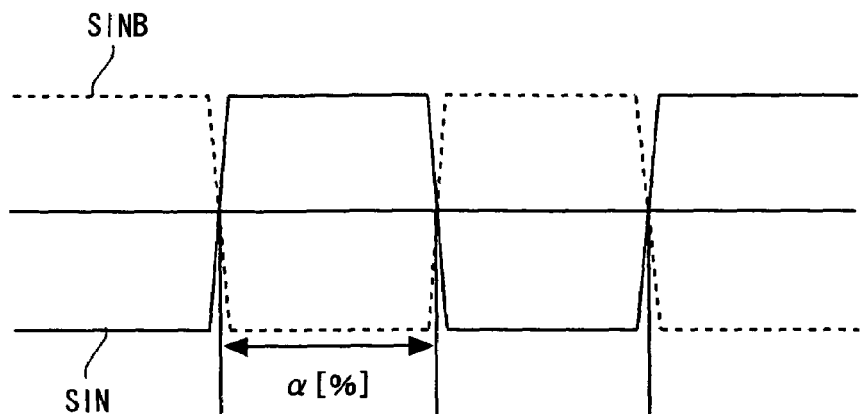
FIGS. 10A to 10C show waveforms of each signal in a signal conversion circuit according to a related art.
Figure 10B:
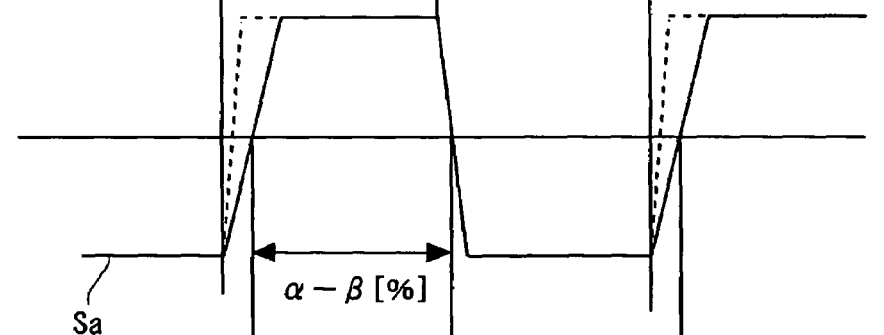
Figure 10C:
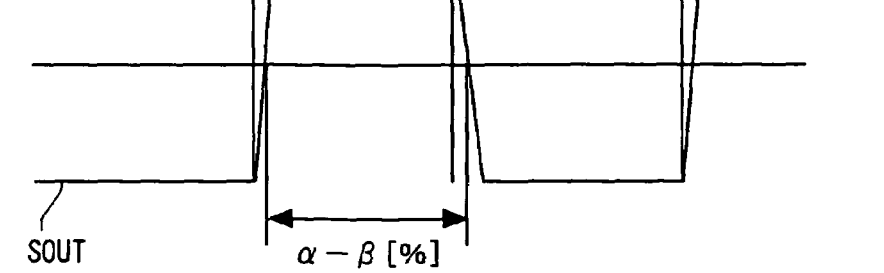

FIG. 5 shows a configuration of the signal conversion circuit of the second embodiment. In FIG. 5, components denoted by reference numerals in FIG. 1 indicate the same elements as in FIG. 1. The signal conversion circuit includes a differential amplifier 180 instead of the differential amplifiers 110 and 120 in FIG. 1. Other components are configured in like wise.

The differential amplifier 180 converts a differential signal being inputted and outputs signals Sa1 and Sa2 with a duty ratio including an error β. That is, the differential amplifier 180 outputs Sa2 that is in-phase with the input signal SIN along with outputting Sa1 that is in-phase with the inverted input signal SINB. Duty ratios of the signals are the same as the ones in the first embodiment. For example a duty ratio of the signal Sa1 is 100−α−β [%] and a duty ratio of the signal Sa2 is α−β [%].

As shown in FIG. 5, the differential amplifier 180 includes P-channel MOS transistors P181 and P182, and N-channel MOS transistors N181 and N182. The P-channel MOS transistor P181 along with the N-channel MOS transistor N181, and the P-channel MOS transistor P182 along with the N-channel MOS transistor N182 are connected vertically in series between a power supply potential and a ground potential. Sources of the N-channel MOS transistor N181 and N182 are connected to a ground potential, and sources of the P-channel MOS transistor P181 and P182 are connected to a power supply potential. Drains of the N-channel MOS transistors N181 and N182, and drains of the P-channel MOS transistor P181 and P182 are respectively connected to each other. A gate of the P-channel MOS transistor P181 is connected to an intermediate node between the P-channel MOS transistor P182 and the N-channel MOS transistor N182, while a gate of the P-channel MOS transistor P182 is connected to an intermediate node between the P-channel MOS transistor P181 and the N-channel MOS transistor N181. A signal Sa1 is outputted from an output node 180a, which is an intermediate node between the P-channel MOS transistor P182 and the N-channel MOS transistor N182. A signal Sb1 is outputted from an output node 180b, which is an intermediate node between the P-channel MOS transistor P181 and the N-channel MOS transistor N181.

Operations and signals in the second embodiment are the same as in the first embodiment, where waveforms for the signals Sa1 and Sb1 outputted from the differential amplifier 180 are formed as in FIGS. 3A to 3D. A difference in rising and falling edges of the signals Sa1 and Sb1 are the same as the first embodiment as well. For example for the signal Sa1, if the inverted input signal SINB rises, the N-channel MOS transistor N181 becomes conductive, a drain potential falls, and the P-channel MOS transistor P182 becomes conductive, thereby making a level of the signal Sa1 rise. If the inverted input signal SINB falls, the N-channel MOS transistor N182 becomes conductive, a drain potential falls, and the P-channel MOS transistor P182 becomes conductive, thereby making a level of the signal Sb1 rise. If the input signal SIN rises (if the inverted input signal SINB rises), the N-channel MOS transistor N181 becomes conductive and a drain potential falls, thereby making a level of the signal Sb1 fall.

In the second embodiment as described in the foregoing, a single-ended signal with a duty ratio larger by an error and a single-ended signal with a duty ratio smaller by an error are generated by one differential amplifier. In this case as well, an error in a duty ratio can be reduced as in the first embodiment.

Comparing the first and the second embodiment, in the first embodiment, as the differential amplifiers 110 and 120 operates only in a potential of an input signal regardless of a potential of an output node, the circuit realizes a high-speed operation to be able to support even a high frequency signal, however it requires considerable amount of power. On the other hand with the second embodiment, in the differential amplifier 180, as P-channel MOS transistors operates depending on a potential of output nodes on other side, it cannot operate at high speed but consumes little power as no unwanted current flows. It is therefore preferable to apply the circuit of the first embodiment in a device that requires a high speed operation, and apply the circuit of the second embodiment in a device that requires low power consumption.

Other Embodiment

Although the above-mentioned example is explained using two types of differential amplifiers, it is not limited to this but a differential amplifier of other configuration may be used if capable of generating signals Sa1 and Sb1, with a duty ratio including an error β and inverted to each other.

In the above example, five inverters are provided to the conversion unit 100. However the inverters may be of any number if the signals Sa and Sb can be outputted from the conversion unit 100. Although those inverters are provided in order to shape a slope of a waveform for an output signal from a differential amplifier in a larger scale, the conversion unit 100 is operable even with the inverter 150 only. In such a case, the signal Sa1 is inputted to the inverter 150, and the signal Sb1 is inputted to the interpolation unit 200 as a signal Sb. Further, the circuit may be configured by grouping the inverters 130 and 140 as a second inverter group that inverts for an even number of times, and grouping the inverters 160 and 170 as a first inverter group that inverts for an even number of times, and providing a plurality of such an inverter group.

Though preferred embodiments of the present invention is described in detail in the foregoing, the present invention is not restricted to the above-mentioned embodiment but various changes may be made.

What is claimed is:

1. A signal conversion circuit for converting an inputted differential signal into a single-ended signal, comprising:
    a differential amplifier circuit for amplifying the differential signal, and generating a first non-inverted signal and a first inverted signal being inverted the first non-inverted signal;
    a first inverter for generating a second non-inverted signal being inverted the first inverted signal; and
an interpolation unit for interpolating a phase difference between the first non-inverted signal and the second non-inverted signal,
    wherein the interpolation circuit comprises:
        a first interpolation inverter for inverting the first non-inverted signal;
        a second interpolation inverter for inverting the second non-inverted signal;
        a third interpolation inverter for inverting depending on a charge/discharge of the capacitor; and
        a capacitor for charging/discharging depending on an output signal from the first and the second interpolation inverters.

2. The signal conversion circuit according to claim 1, wherein the differential amplifier circuit comprises:
    a first differential pair for generating the first non-inverted signal; and
    a second differential pair for generating the first inverted signal.

3. The signal conversion circuit according to claim 2, wherein the first and the second differential pairs comprise:
    a first transistor inputted one signal of the differential signal to a control terminal;
    a second transistor connected in series to the first transistor;
    a third transistor inputted another signal of the differential signal to a control terminal; and
    a fourth transistor connected in series to the third transistor to form a current mirror with the second transistor,
    wherein the first non-inverted signal or the first inverted signal is outputted from an intermediate node between the third transistor and the fourth transistor.

4. The signal conversion circuit according to claim 1, wherein the differential amplifier circuit comprises a differential pair for outputting the first non-inverted signal from one output terminal and outputting the first inverted signal from another output terminal.

5. The signal conversion circuit according to claim 4, wherein the differential amplifier circuit comprises two differential pair circuits, one differential pair circuit outputting a first non-inverted signal and a second differential pair circuit outputting a first inverted signal, and each differential pair circuit comprises:
    a first transistor inputted one signal of the differential signal to a control terminal;
    a second transistor connected in series to the first transistor;
    a third transistor inputted another signal of the differential signal to a control terminal; and
    a fourth transistor connected in series to the third transistor,
    wherein an intermediate node between the first transistor and the second transistor of one differential pair circuit is connected to a control terminal of the fourth transistor in the differential pair circuit that outputs one of the first non-inverted signal or the first inverted signal, and an intermediate node between the third transistor and the fourth transistor of the second differential pair is connected to a control terminal of the second transistor in the differential pair circuit that outputs the other of the first non-inverted signal and the first inverted signal.

6. The signal conversion circuit according to claim 1, further comprising:
    a first inverter group for inverting the first non-inverted signal for an even number of times and inputting the first non-inverted signal to the interpolation circuit; and
    a second inverter group for inverting the first inverted signal for an even number of times and inputting the inverted signal to the first inverter.

7. A signal conversion circuit comprising:
    a conversion unit for converting a differential signal being inputted into a first single-ended signal and a second single-ended signal, said first single-ended signal having a duty ratio larger by an error compared to a duty ratio of said inputted differential signal and a said second single-ended signal having a duty ratio smaller by an error compared to said duty ratio of said inputted differential signal; and
    an interpolation unit for interpolating the first single-ended signal and the second single-ended signal.

8. The signal conversion circuit according to claim 7, wherein the first and the second single-ended signals are non-inverted signals which are the amplified differential signal.

9. The signal conversion circuit according to claim 8, wherein the conversion unit comprises:
    a first inverter group for inverting the amplified differential signal for an even number of times and transferring the amplified differential signal as the first single-ended signal; and
    a second inverter group for inverting the amplified differential signal for an odd number of times and transferring the amplified differential signal as the second single-ended signal.

10. The signal conversion circuit according to claim 8, wherein the conversion unit comprises a first differential pair transistor for amplifying the differential signal and the first and the second single-ended signals are generated according to a differential signal amplified by the first differential pair transistor.

11. The signal conversion circuit according to claim 8, wherein:
    the conversion unit comprises a first and a second differential pair transistors for amplifying the differential signal;
    the first single-ended signal is generated according to a signal that is a differential signal amplified by the first differential pair transistor; and
    the second single-ended signal is generated according to a signal that is a differential signal amplified by the second differential pair transistor.

12. The signal conversion circuit according to claim 7, wherein:
    the interpolation unit sets a waveform that lies almost midway between a rising waveform of the first single-ended signal and a rising waveform of the second single-ended signal to be a rising waveform for an output signal, and
    a waveform that lies almost midway between a falling waveform of the first single-ended signal and a falling waveform of the second single-ended signal to be a falling waveform for an output signal.

13. A signal conversion circuit for converting an inputted differential signal into a single-ended signal, comprising:

a differential amplifier circuit for amplifying the differential signal, and generating a first non-inverted signal and a first inverted signal being inverted the first non-inverted signal;

a first inverter for generating a second non-inverted signal being inverted the first inverted signal; and an interpolation unit for interpolating a phase difference between the first non-inverted signal and the second non-inverted signal, wherein the interpolation circuit comprises:

a first and a second interpolation transistors for inputting the first non-inverted signal to a control terminal;

a third and a fourth interpolation transistors for inputting the second non-inverted signal to a control terminal;

a first parallel circuit including the first interpolation transistor and the third interpolation transistor connected in parallel to the first transistor;

a second parallel circuit including the second interpolation transistor and the fourth interpolation transistor connected in parallel to the second transistor, and connected in series with the first parallel circuit; and a capacitor connected to an intermediate node between the first parallel circuit and the second parallel circuit.

* * * * *